United States Patent
Bajaj et al.

(10) Patent No.: US 12,322,592 B2
(45) Date of Patent: Jun. 3, 2025

(54) DEPOSITION OF SILICON-BASED DIELECTRIC FILMS

(71) Applicant: Applied Materials, Inc., Santa Clara, CA (US)

(72) Inventors: Geetika Bajaj, New Delhi (IN); Prerna Sonthalia Goradia, Mumbai (IN); Seshadri Ganguli, Sunnyvale, CA (US); Srinivas Gandikota, Santa Clara, CA (US); Robert Jan Visser, Menlo Park, CA (US); Suraj Rengarajan, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 706 days.

(21) Appl. No.: 17/667,700

(22) Filed: Feb. 9, 2022

(65) Prior Publication Data

US 2022/0270870 A1   Aug. 25, 2022

Related U.S. Application Data

(60) Provisional application No. 63/148,964, filed on Feb. 12, 2021.

(51) Int. Cl.
H01L 21/02 (2006.01)

(52) U.S. Cl.
CPC .... *H01L 21/0228* (2013.01); *H01L 21/02164* (2013.01); *H01L 21/02211* (2013.01); *H01L 21/0234* (2013.01)

(58) Field of Classification Search
None
See application file for complete search history.

(56) References Cited

U.S. PATENT DOCUMENTS

| | | | |
|---|---|---|---|
| 9,875,888 | B2 | 1/2018 | Yan et al. |
| 10,170,298 | B2 | 1/2019 | Yan et al. |
| 2015/0275355 | A1 | 10/2015 | Mallikarjunan et al. |
| 2016/0276148 | A1 | 9/2016 | Qian et al. |
| 2018/0033614 | A1 | 2/2018 | Chandra et al. |

(Continued)

FOREIGN PATENT DOCUMENTS

KR   20210012008 A   2/2021

OTHER PUBLICATIONS

Nam, Taewook, et al., "Low-temperature, high-growth-rate ALD of SiO2 using aminodisilane precursor", Applied Surface Science 485 (2019) 381-390.

(Continued)

*Primary Examiner* — Asok K Sarkar
(74) *Attorney, Agent, or Firm* — SERVILLA WHITNEY LLC

(57) ABSTRACT

A processing method comprises positioning a substrate in a processing chamber and setting a temperature of the substrate to a range of 50° C. to 500° C.; conducting an atomic layer deposition (ALD) cycle on the substrate; and repeating the ALD cycle to form a silicon oxide film. The ALD cycle comprises: exposing the substrate to an aminosilane precursor in the processing chamber by pulsing a flow of the aminosilane precursor; purging the processing chamber of the aminosilane precursor; exposing the substrate to an oxidizing agent by pulsing a flow of the oxidizing agent for a duration in a range of greater than or equal to 100 milliseconds to less than or equal to 3 seconds; and purging the processing chamber of the oxidizing agent.

18 Claims, 3 Drawing Sheets

(56) References Cited

U.S. PATENT DOCUMENTS

| | | |
|---|---|---|
| 2019/0385850 A1 | 12/2019 | Arghavani et al. |
| 2020/0219718 A1 | 7/2020 | Smith et al. |
| 2020/0308416 A1 | 10/2020 | Lei et al. |
| 2020/0395211 A1 | 12/2020 | Jia et al. |

OTHER PUBLICATIONS

Kim, Dae Hyun, et al., "Thermal Atomic Layer Deposition of Device-Quality $SiO_2$ Thin Films under 100° C. Using an Aminodisilane Precursor", Chem. Mater. 2019, 31, 5502-5508.

PCT International Search Report and Written Opinion in PCT/US2022/016084 dated May 25, 2022, 13 pages.

DEPOSITION OF SILICON-BASED DIELECTRIC FILMS

CROSS-REFERENCE TO RELATED APPLICATIONS

This application claims priority to U.S. Provisional Application No. 63/148,964, filed Feb. 12, 2021, the entire disclosure of which is hereby incorporated by reference herein.

TECHNICAL FIELD

Embodiments of the present disclosure generally relate to semiconductor devices and methods of depositing thin films, and more particularly to atomic layer deposition (ALD) of silicon-based dielectric layers and films.

BACKGROUND

Silicon dioxide ($SiO_2$) has been a suitable dielectric material for many semiconductor applications. $SiO_2$ is typically grown by thermal methods at temperatures of 800° C. and above. With advances in semiconductor technology and complex geometry, challenges arise with respect to conformal coatings. Atomic layer deposition (ALD) of $SiO_2$ can be used to deposit conformal coatings, but qualities of resulting ALD films are generally inferior as compared to thermal oxidation techniques. ALD employs chemisorption to deposit a saturated monolayer of reactive precursor molecules onto a substrate surface.

Film layers of greater than one monolayer may be achieved by cyclically alternating the pulsing of appropriate reactive precursors into a deposition chamber. Each exposure of the deposition surface to a reactive precursor may be separated spatially and/or temporally by an inert gas purge and/or vacuum. The sequential exposure of a surface to the ALD precursor and reactant may add a new atomic layer to previously deposited layers to form a uniform material layer on the surface of a substrate. Cycles of reactive precursor(s) and inert purge gas(es) are repeated to form a material film layer with a desired thickness.

High aspect ratio apertures including contacts, vias, lines, and other features used to form multilevel interconnects, continue to decrease in size as manufacturers strive to increase circuit density and quality. The deposition of conformal layers in features with ultra-high aspect ratios is further challenging.

There is a continuing need to deposit high quality silicon-based dielectric films, in particular with respect to depositing conformal silicon oxide ($SiO_x$) layers or films, in particular silicon dioxide ($SiO_2$) layers or films, into high aspect ratio features of semiconductor devices.

SUMMARY

One or more embodiments are directed to a processing method comprising: positioning a substrate in a processing chamber and setting a temperature of the substrate to a range of 50° C. to 500° C.; conducting an atomic layer deposition (ALD) cycle on the substrate; and repeating the ALD cycle to form a silicon oxide film. The ALD cycle comprises: exposing the substrate to an aminosilane precursor in the processing chamber by pulsing a flow of the aminosilane precursor; purging the processing chamber of the aminosilane precursor; exposing the substrate to an oxidizing agent by pulsing a flow of the oxidizing agent for a duration in a range of greater than or equal to 100 milliseconds to less than or equal to 3 seconds; and purging the processing chamber of the oxidizing agent.

Additional embodiments are directed to a processing method comprising: positioning a substrate having a substrate surface in a processing chamber and setting a temperature of the substrate to a range of 75° C. to 350° C., the substrate surface having at least one feature thereon; conducting an atomic layer deposition (ALD) cycle on the substrate; and repeating the ALD cycle to form a conformal silicon oxide film in the feature. The ALD cycle comprises: exposing the substrate surface to an aminodisilane precursor in the processing chamber by pulsing a flow of the aminodisilane precursor; purging the processing chamber of the aminodisilane precursor; exposing the substrate surface to an oxidizing agent by pulsing a flow of the oxidizing agent for a duration in a range of greater than or equal to 100 milliseconds to less than or equal to 3 seconds; and purging the processing chamber of the oxidizing agent.

Further embodiments are directed to non-transitory computer readable medium including instructions, that, when executed by a controller of a processing chamber, causes the processing chamber to perform operations of: positioning a substrate in a processing chamber and setting a temperature of the substrate to a range of 50° C. to 500° C.; conducting an atomic layer deposition (ALD) cycle on the substrate; and repeating the ALD cycle to form a silicon oxide film. The ALD cycle comprises: exposing the substrate to an aminosilane precursor in the processing chamber by pulsing a flow of the aminosilane precursor; purging the processing chamber of the aminosilane precursor; exposing the substrate to an oxidizing agent by pulsing a flow of the oxidizing agent for a duration in a range of greater than or equal to 100 milliseconds to less than or equal to 5 seconds; and purging the processing chamber of the oxidizing agent.

DETAILED DESCRIPTION

Figure 1:
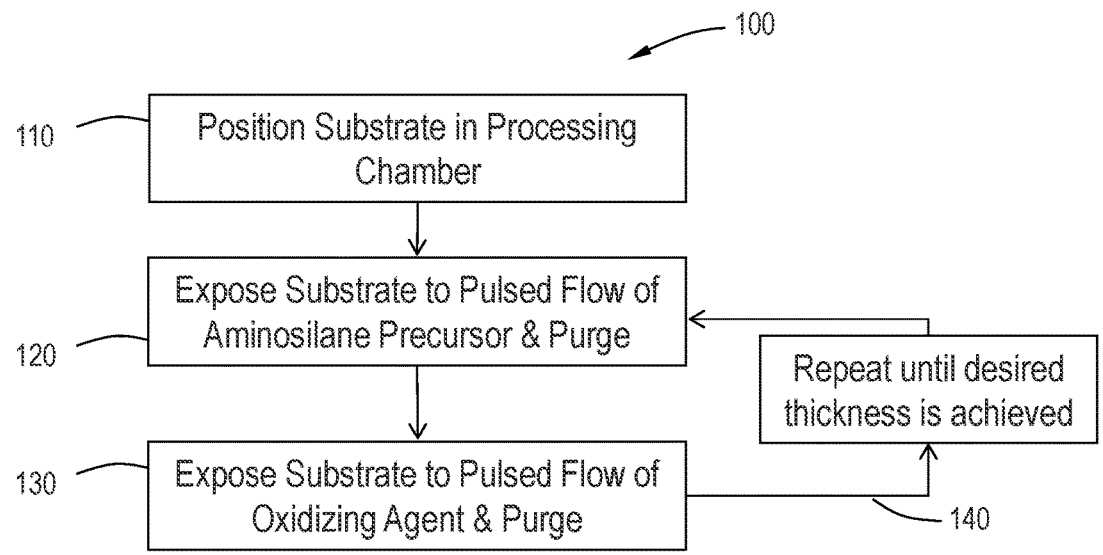
FIG. 1 is a flowchart of a processing method in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used herein, the term "conformal" refers to a layer that adheres to and uniformly covers exposed surfaces with a thickness having a variation of less than 5% relative to the average thickness of the film. For example, a 1,000 Å thick film would have less than 50 Å variation in thickness. This thickness and variation include edges, corners, sides, and the bottom of recesses. For example, a conformal layer deposited by ALD in various embodiments of the disclosure would provide coverage over the deposited region of essentially uniform thickness on complex surfaces.

As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

Aspect ratio of a feature is the ratio of the depth D of the feature relative to the width W of the feature. A higher aspect ratio feature will have a narrower/longer shape than a lower aspect ratio feature. In some embodiments, the features have an aspect ratio greater than or equal to about 5:1, 6:1, 7:1, 8:1, 9:1, 10:1, 15:1, 20:1, 25:1 30:1, 35:1, 40:1, 45:1, 50:1, 55:1, 60:1, 65:1, 70:1, 75:1, 80:1, 85:1, 90:1, 95:1, or 100:1.

As used herein, "consists essentially of" with respect to composition of a layer means that the stated elements compose greater than 95%, greater than 98%, greater than 99% or greater than 99.5% of the stated material on an atomic basis. For the avoidance of doubt, no stoichiometric ratios are implied by the identification of materials disclosed herein. For example, a SiO material contains silicon and oxygen. These elements may or may not be present at a 1:1 ratio. Reference herein to a silicon oxide ($SiO_x$) includes any stoichiometry, including silicon dioxide ($SiO_2$).

A "pulse" as used herein is intended to refer to a quantity of reactive precursor that is intermittently or non-continuously introduced into the process chamber. The quantity of a particular compound within each pulse may vary over time, depending on the duration of the pulse.

The durations for each pulse may be the same or variable and may be adjusted to accommodate, for example, the volume capacity of the processing chamber as well as the capabilities of a vacuum system coupled thereto.

Embodiments herein relate to processing methods for making silicon oxide ($SiO_x$) layers and films, specifically silicon dioxide ($SiO_2$) layers and films, where the resulting films advantageously have improved qualities, are conformal, and have good electrical properties.

Principles and embodiments of the present disclosure relate to depositing a silicon oxide layer or film, in particular an $SiO_2$ layer/film utilizing an aminosilane precursor that reacts with oxygen on a substrate surface.

In one or more embodiments, the aminosilane precursor is an aminodisilane or a mono-substituted aminosilane.

In one or more embodiments, the aminosilane precursor is an aminoaminodisilane. In one or more embodiments, the aminoaminodisilane has a general formula of $Si_2X_4(N(R_1R_2))(N(R_3R_4))$ where each X is independently selected from the group consisting of: hydrogen (H) and a halide, the halide being selected from the group consisting of: fluorine (F), chlorine (Cl), bromine (Br), and iodine (I); and each of $R_1$ to $R_4$ is independently selected from a linear or branched C1-C10 alkyl groups. In one or more embodiments, the aminodisilane comprises 1,2-bis(diisopropylamino)aminodisilane (BDIPADS).

In one or more embodiments, the aminosilane precursor is a mono-substituted aminosilane. In one or more embodiments, the mono-substituted aminosilane has a general formula of $H_3Si:NY_3$, wherein each Y is independently an alkyl group, including but not limited to a linear or branched C1-C10 alkyl group. In one or more embodiments, the mono-substituted aminosilane excludes halogen-based compounds. In one or more embodiments, the mono-substituted aminosilane comprises di(sec-butylamino) silane (DSBAS).

In one or more embodiments, the $SiO_2$ film forms conformally on a device feature. In some embodiments, the feature contains essentially no carbon or nitrogen contaminants. As used in this regard, essentially no contaminants means that there is less than about 5 atomic percent carbon or nitrogen in the feature.

Sample $SiO_2$ films were grown by ALD according to methods herein using a pulsed flow of aminodisilane precursor of 1,2-bis(diisopropylamino)aminodisilane (BDIPADS) and a pulsed flow of ozone ($O_3$) at various substrate temperatures. The resulting films were analyzed by x-ray photoelectron spectroscopy (XPS), and the information is provided in Table 1.

TABLE 1

| ALD $SiO_2$ Substrate Temperature, ° C. | Average composition (at. %) in bulk film | | | |
|---|---|---|---|---|
| | C1s | O1s | Si2p | Si:O |
| 200 | <5 | 57.47 | 31.04 | 1:1.85 |
| 225 | <5 | 60.24 | 32.09 | 1:1.88 |
| 250 | <5 | 56.85 | 31.04 | 1:1.83 |

The stoichiometric ratio for Si:O was approximately 1:1.8. Carbon content in the films was less than 5 atomic %. In some embodiments, the stoichiometric ratio for Si:O was in a range of approximately 1:1.8 to 1:2.

An aspect of the present disclosure relates generally to methods of depositing continuous, conformal $SiO_2$ layers on a substrate comprising exposing a substrate surface sequentially to a first Si precursor to produce a single layer of first Si precursor molecules, partial or whole of the molecule, bound to the substrate surface. The first Si precursor molecules bound to the substrate surface are exposed to a first oxygen source, where oxygen from the first oxygen source reacts with the first Si precursor molecules bound to the substrate surface. The sequential exposure of the substrate surface to the first Si precursor molecules and the first oxygen source can be repeated until a continuous, conformal, SiO$_2$ layer with a predetermined thickness is produced on the substrate surface.

FIG. 1 illustrates a flow chart for an exemplary embodiment of a processing method 100 for the deposition of SiO$_2$ by ALD in general terms. At operation 110, a substrate is positioned in a processing chamber. At operation 120, the substrate is exposed to pulsed flow of an aminosilane precursor and purging. At operation 130, the substrate is exposed to pulsed flow of an oxidizing agent and purging. At operation, 140, the operations at 120 and 130, which in one or more embodiments are collectively referred to as an atomic layer deposition (ALD) cycle, are repeated until a desired thickness is achieved.

Figure 2:
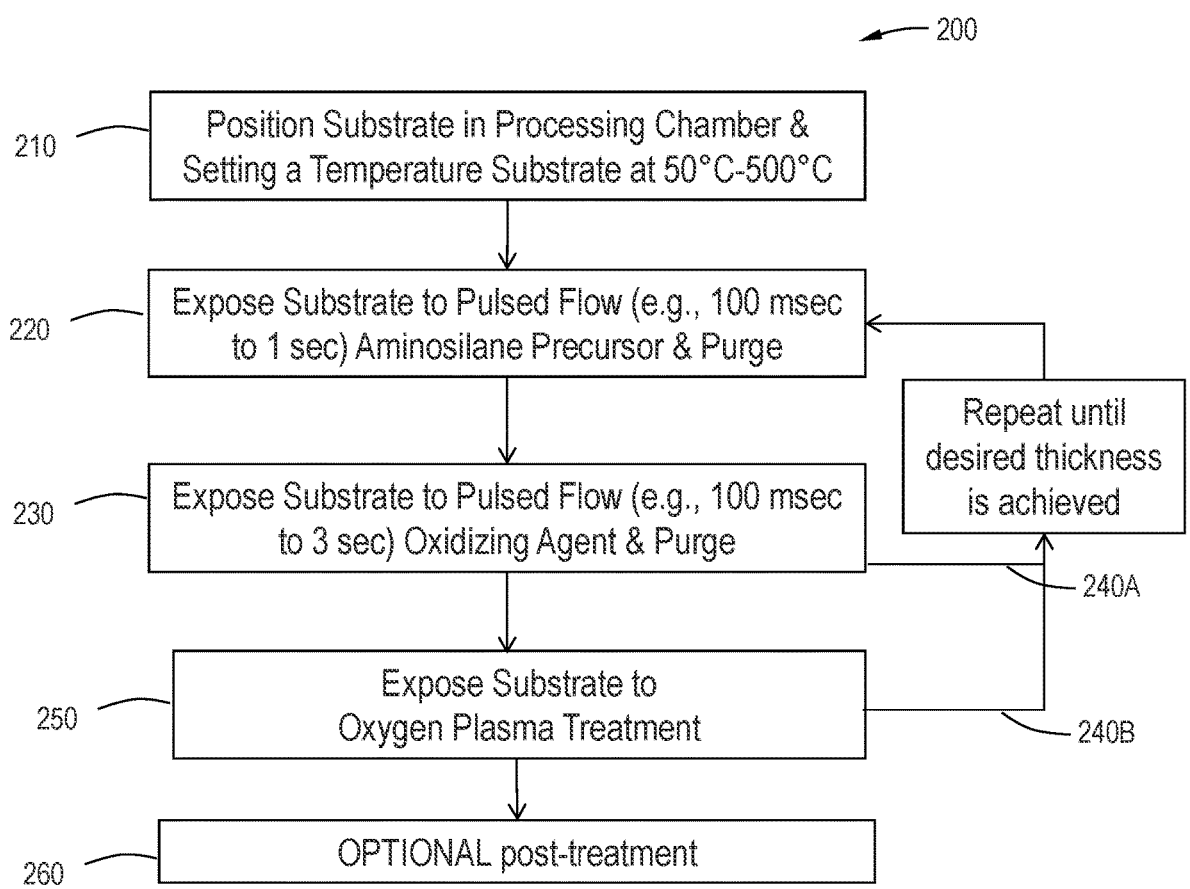
FIG. 2 is a flowchart of a processing method in accordance with one or more embodiments of the disclosure.

FIG. 2 illustrates a flow chart for an exemplary embodiment of a processing method 200 for the deposition of SiO$_2$ by ALD. At operation 210, a substrate is positioned in a processing chamber, and a temperature of the substrate is set to a range of 50° C. to 500° C., including all values and subranges therebetween, including 75° C. to 350° C., and 100° C. to 250° C.

At operation 220, the substrate is exposed to pulsed flow of an aminosilane precursor and purging. A duration of the pulsed flow of the aminosilane precursor is in a range of greater than or equal to 100 milliseconds to less than or equal to 1 seconds, including all values and subranges therebetween, including greater than or equal to 275 milliseconds to less than or equal to 500 milliseconds.

At operation 230, the substrate is exposed to pulsed flow of an oxidizing agent and purging. A duration of the pulsed flow of the oxidizing agent is in a range of greater than or equal to 100 milliseconds to less than or equal to 3 seconds, including all values and subranges therebetween, including greater than or equal to 275 milliseconds to less than or equal to 2 milliseconds.

At operation 240A, the operations at 220 and 230, which in one or more embodiments are collectively referred to as an atomic layer deposition (ALD) cycle, are repeated until a desired thickness is achieved.

At operation 250, the substrate is exposed to an oxygen plasma treatment. In one or more embodiments, the oxygen plasma treatment includes the following conditions: a pressure of less than or equal to 50 torr; a gas selected from the group consisting of: oxygen, argon, hydrogen, water, and mixtures thereof; plasma generated by: capacitively coupled plasma or inductively coupled plasma or microwave.

Optionally, at operation 240B, the ALD cycle is further conducted after the operation 250.

At operation, 260, the substrate is exposed to one or more optional post-treatments.

Figure 3:
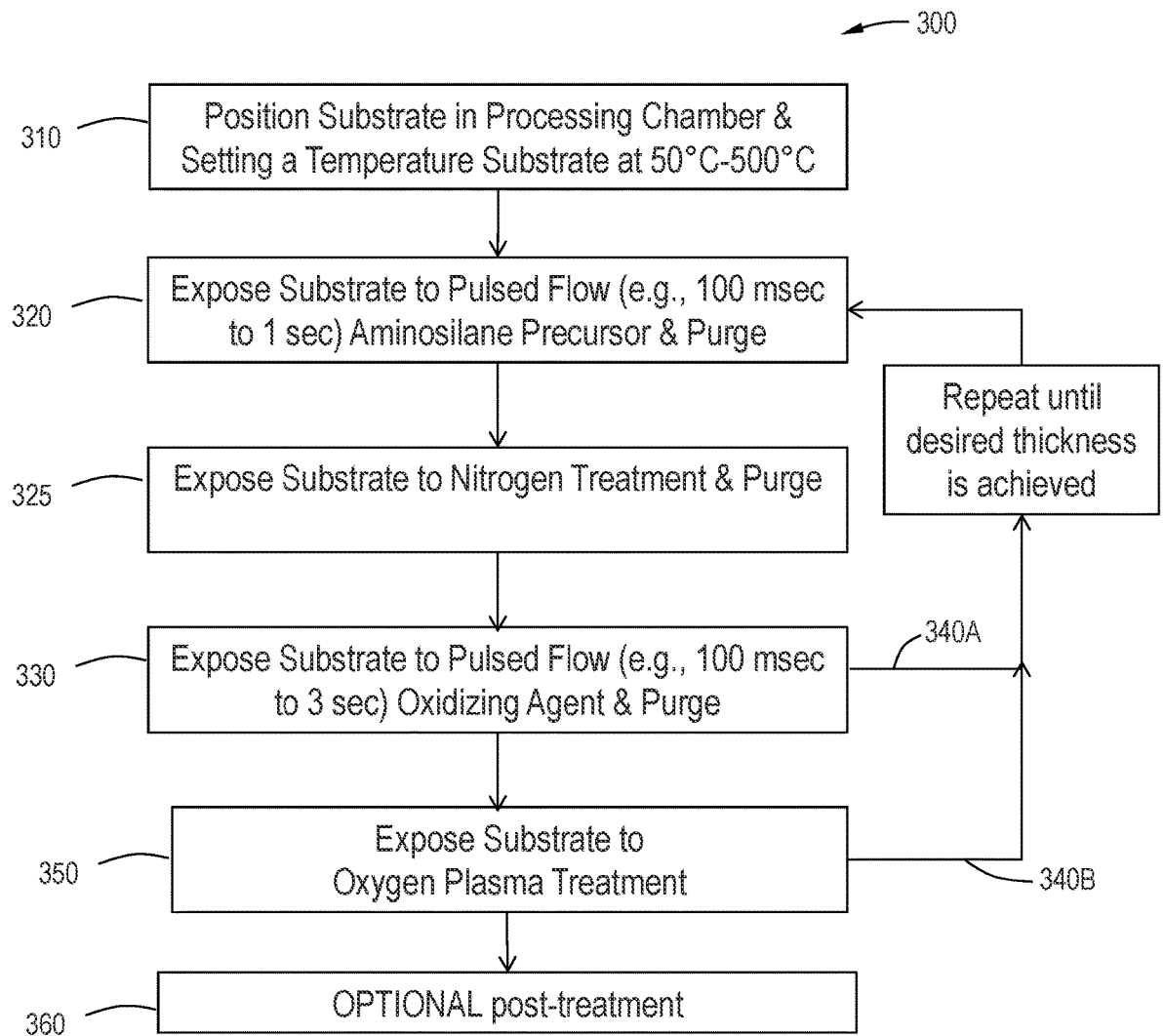
FIG. 3 is a flowchart of a processing method in accordance with one or more embodiments of the disclosure.

FIG. 3 illustrates a flow chart for an exemplary embodiment of a processing method 300 for the deposition of SiO$_2$ by ALD. At operation 310, a substrate is positioned in a processing chamber, and a temperature of the substrate is set to a range of 50° C. to 500° C., including all values and subranges therebetween, including 75° C. to 350° C., and 100° C. to 250° C.

At operation 320, the substrate is exposed to pulsed flow of an aminosilane precursor and purging. A duration of the pulsed flow of the aminosilane precursor is in a range of greater than or equal to 100 milliseconds to less than or equal to 1 seconds, including all values and subranges therebetween, including greater than or equal to 275 milliseconds to less than or equal to 500 milliseconds.

At operation 325, the substrate is exposed to a nitrogen treatment. In one or more embodiments, the nitrogen treatment comprises a nitrogen-containing plasma. In one or more embodiments, the nitrogen treatment comprises a hydrazine-containing base.

At operation 330, the substrate is exposed to pulsed flow of an oxidizing agent and purging. A duration of the pulsed flow of the oxidizing agent is in a range of greater than or equal to 100 milliseconds to less than or equal to 3 seconds, including all values and subranges therebetween, including greater than or equal to 275 milliseconds to less than or equal to 2 milliseconds.

At operation 340A, the operations at 320, 325, and 330, which in one or more embodiments are collectively referred to as an atomic layer deposition (ALD) cycle, are repeated until a desired thickness is achieved.

At operation 350, the substrate is exposed to an oxygen plasma treatment analogous to operation 250 of FIG. 2.

Optionally, at operation 340B, the ALD cycle is further conducted after the operation 350.

At operation 360, the substrate is exposed to one or more optional post-treatments.

Optional post-treatments in accordance with operation 260 of FIG. 2 and operation 360 of FIG. 3 include but are not limited to thermal and/or oxidation treatments.

In one or more embodiments, a thermal annealing treatment of the silicon dioxide film is conducted in an oxygen-containing environment after conducting a plurality of ALD cycles. In other embodiments, a thermal annealing treatment of the silicon dioxide film is conducted in an oxygen-free environment after conducting a plurality of ALD cycles. In one or more embodiments, the thermal annealing treatment includes an environment of: oxygen (O$_2$) or oxygen-containing plasma. Exemplary oxygen-containing plasmas include but are not limited to oxygen (O$_2$) plasma, oxygen (O$_2$)/hydrogen (H$_2$) mix plasma, oxygen (O$_2$)/water (H$_2$O) mix plasma, argon (Ar) plasma, nitrogen (N$_2$) plasma, and argon (Ar)/nitrogen (N$_2$) mix plasma.

In one or more embodiments, the plasma treatment may be selected from a remote plasma, a direct plasma, and a microwave plasma. In one or more embodiments, a plasma treatment selected from a remote plasma, a direct plasma, and a microwave plasma of the silicon dioxide film is conducted in an oxygen-containing environment after conducting a plurality of ALD cycles. In one or more embodiments, a microwave plasma treatment of the silicon dioxide film is conducted in an oxygen-containing environment after conducting a plurality of ALD cycles. In one or more embodiments, the plasma treatment includes an environment of an oxygen-containing plasma including but are not limited to: oxygen (O$_2$) plasma, oxygen (O$_2$)/hydrogen (H$_2$) mix plasma, and oxygen (O$_2$)/water (H$_2$O) mix plasma.

The oxidizing agent of one or more embodiments may be any suitable oxidizing agent known to the skilled artisan. In one or more embodiments, the oxidizing agent includes one or more of ozone (O$_3$), hydrogen peroxide (H$_2$O$_2$), or oxygen-containing plasma.

Methods of this disclosure can be performed in the same chamber or in one or more separate processing chambers. In some embodiments, SiO$_2$ deposition and treatment is conducted by multiple cycles of processing operations. In some embodiments, SiO$_2$ deposition and treatment is repeated between two chambers to achieve a desired thickness.

In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, a suitable processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation, and other substrate processes. By carrying out processes in a chamber on a cluster tool, surface contamination of the substrate with atmospheric impurities can be avoided without oxidation prior to depositing a subsequent film.

In some embodiments, the first processing chamber and the second processing chamber are part of the same, clustered, processing tool. Accordingly, in some embodiments, the method is an in-situ integrated method.

In some embodiments, the first processing chamber and the second processing chamber are different processing tools. Accordingly, in some embodiments, the method is an ex-situ integrated method.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, and/or cleaning processes throughout the carousel path.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited. Furthermore, a lot of time can be used to purge a chamber, and therefore throughput can be increased by eliminating the purge step.

Figure 4:
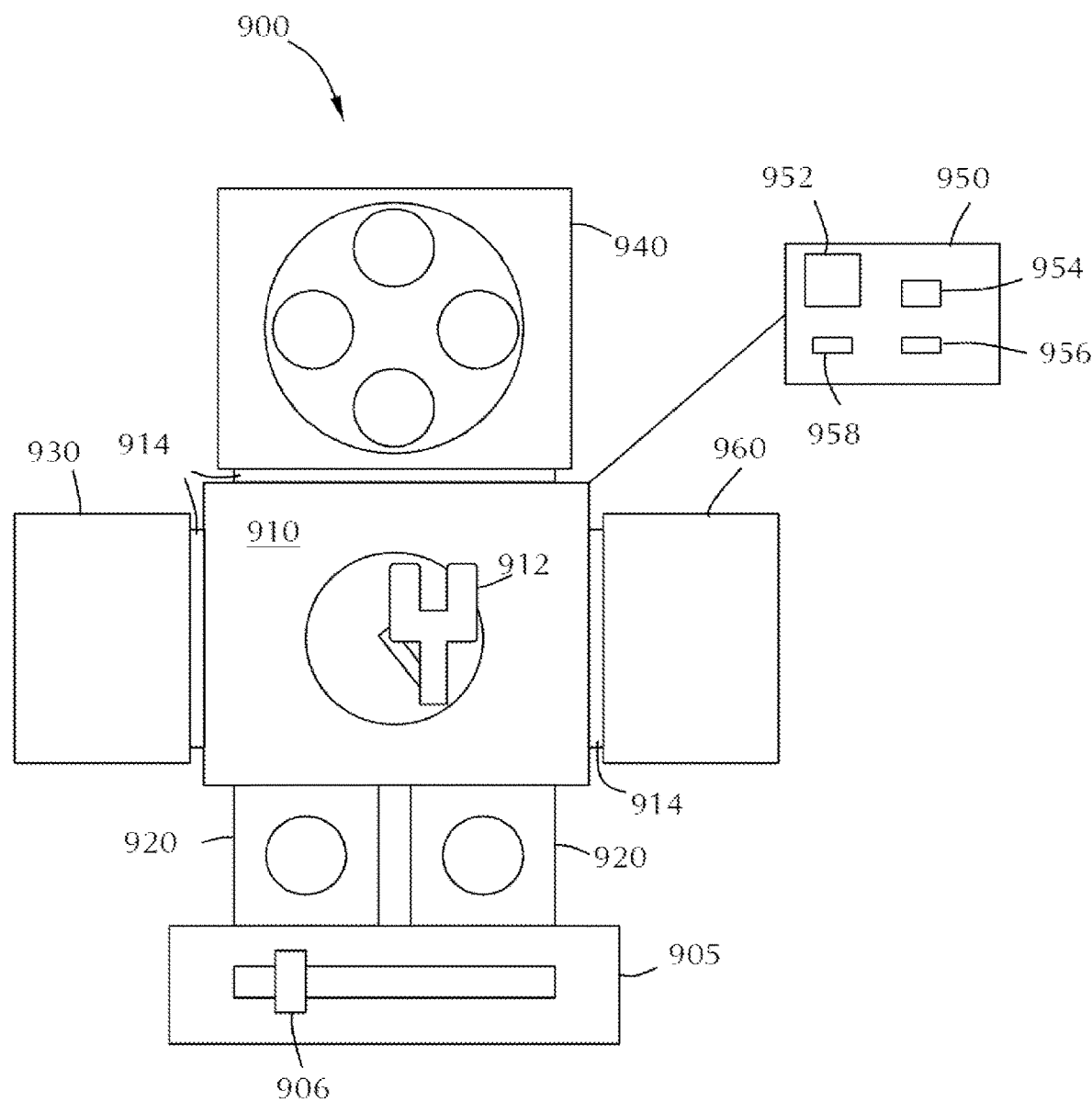
FIG. 4 is a cluster tool accordance with one or more embodiments of the disclosure.

With reference to FIG. 4, additional embodiments of the disclosure are directed to a processing system 900 for executing the methods described herein. FIG. 4 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source, or a plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 4, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as an atomic layer deposition chamber for depositing a silicon oxide ($SiO_x$) film and may be in fluid communication with one or more reactive gas sources to provide one or more flows of reactive gases to the first processing chamber 930. The substrate can be moved to and from the processing chamber 930 by the robot 912 passing through isolation valve 914.

Processing chamber 940 can also be connected to the central transfer station 910. In some embodiments, processing chamber 940 can also be configured as an oxygen plasma treatment chamber for treating the $SiO_x$ film and is fluid communication with one or more reactive gas sources to provide flows of reactive gas to the processing chamber 940. The substrate can be moved to and from the processing chamber 940 by robot 912 passing through isolation valve 914.

In some embodiments, processing chamber 960 is connected to the central transfer station 910. In some embodiments, processing chamber 960 can be configured as either a deposition chamber for depositing a silicon oxide ($SiO_x$) film or as an oxygen plasma treatment chamber for treating the $SiO_x$ film or as a post-treatment chamber and is fluid communication with one or more reactive gas sources to provide flows of reactive gas to the processing chamber 960.

In some embodiments, each of the processing chambers 930, 940, and 960 are configured to perform different portions of the processing method. The skilled artisan will recognize that the number and arrangement of individual processing chamber on the tool can be varied, and that the embodiment illustrated in FIG. 4 is merely representative of one possible configuration.

In some embodiments, the processing system 900 includes one or more metrology stations. For example, metrology stations can be located within pre-clean/buffer chamber 920, within the central transfer station 910 or within any of the individual processing chambers. The metrology station can be any position within the system 900 that allows the distance of the recess to be measured without exposing the substrate to an oxidizing environment.

At least one controller 950 is coupled to one or more of the central transfer station 910, the pre-clean/buffer chamber 920, processing chambers 930, 940, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random-access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; and a configuration to deposit a silicon oxide ($SiO_x$) film.

An embodiment provides a non-transitory computer readable medium including instructions, that, when executed by a controller of a processing chamber, causes the processing chamber to perform operations of positioning a substrate in a processing chamber and setting a temperature of the substrate to a range of 50° C. to 500° C.; conducting an atomic layer deposition (ALD) cycle on the substrate; and repeating the ALD cycle to form a silicon oxide film. The ALD cycle comprises: exposing the substrate to an aminosilane precursor in the processing chamber by pulsing a flow of the aminosilane precursor; purging the processing chamber of the aminosilane precursor; exposing the substrate to an oxidizing agent by pulsing a flow of the oxidizing agent for a duration in a range of greater than or equal to 100 milliseconds to less than or equal to 5 seconds; and purging the processing chamber of the oxidizing agent.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A processing method comprising:
conducting an atomic layer deposition (ALD) cycle on a substrate at a temperature in a range of from 50° C. to 500° C., the ALD cycle comprising:
exposing the substrate to an aminosilane precursor in the processing chamber by pulsing a flow of the aminosilane precursor;
purging the processing chamber of the aminosilane precursor;
conducting a nitrogen treatment including a nitrogen-containing plasma or a hydrazine-containing base on the substrate;
exposing the substrate to an oxidizing agent by pulsing a flow of the oxidizing agent; and
purging the processing chamber of the oxidizing agent; and
repeating the ALD cycle to form a silicon oxide ($SiO_2$) film.

2. The method of claim 1, wherein the aminosilane precursor is an aminodisilane or a mono-substituted aminosilane.

3. The method of claim 2, wherein the aminodisilane has a general formula of $Si_2X_4(N(R_1R_2))(N(R_3R_4))$ where each X is independently selected from the group consisting of: hydrogen (H) and a halide, the halide being selected from the group consisting of: fluorine (F), chlorine (Cl), bromine (Br), and iodine (I); and each of $R_1$ to $R_4$ is independently selected from a linear or branched C1-C10 alkyl groups, or the mono-substituted aminosilane has a general formula of $H_3Si:NY_3$, wherein each Y is independently a linear or branched C1-C10 alkyl group.

4. The method of claim 2, wherein the aminosilane precursor is the aminodisilane, comprising 1,2-bis(diisopropylamino)aminodisilane (BDIPADS).

5. The method of claim 2, wherein the aminosilane precursor is the mono-substituted aminosilane comprising di(sec-butylamino) silane (DSBAS).

6. The method of claim 1, wherein the oxidizing agent comprises ozone ($O_3$), hydrogen peroxide ($H_2O_2$), or oxygen-containing plasma.

7. The method of claim 1, further comprising conducting an oxygen plasma treatment after conducting a plurality of ALD cycles.

8. The method of claim 1, further comprising conducting a thermal annealing treatment of the silicon dioxide film in an oxygen-containing environment after conducting a plurality of ALD cycles.

9. The method of claim 1, further comprising conducting a microwave plasma treatment of the silicon dioxide film in an oxygen-containing environment after conducting a plurality of ALD cycles.

10. The method of claim 1, wherein the pulsing of the flow of the aminosilane precursor is for a duration of greater than or equal to 100 milliseconds to less than or equal to 1 second.

11. A processing method comprising:
conducting an atomic layer deposition (ALD) cycle on a substrate at a temperature in a range of from 75° C. to 350° C., the substrate having a substrate surface having at least one feature thereon, the ALD cycle comprising:
exposing the substrate surface to an aminodisilane precursor in the processing chamber by pulsing a flow of the aminodisilane precursor;
purging the processing chamber of the aminodisilane precursor;
conducting a nitrogen treatment including a nitrogen-containing plasma or a hydrazine-containing base on the substrate;
exposing the substrate surface to an oxidizing agent by pulsing a flow of the oxidizing agent; and
purging the processing chamber of the oxidizing agent; and
repeating the ALD cycle to form a conformal silicon oxide ($SiO_2$) film in the feature.

12. The method of claim 11, wherein the feature has an aspect ratio of greater than or equal to 5:1.

13. The method of claim 11, wherein the aminodisilane precursor comprises 1,2-bis(diisopropylamino)aminodisilane (BDIPADS).

14. The method of claim 11, wherein the pulsing of the flow of the aminodisilane precursor is for a duration of greater than or equal to 100 milliseconds to less than or equal to 1 second.

15. The method of claim 11, wherein the oxidizing agent comprises ozone ($O_3$), hydrogen peroxide ($H_2O_2$), or oxygen-containing plasma.

16. The method of claim 11, further comprising conducting an oxygen plasma treatment after conducting a plurality of ALD cycles.

17. The method of claim 11, further comprising after conducting a plurality of ALD cycles, conducting a thermal annealing treatment of the silicon dioxide film in an oxygen-containing environment, or comprising conducting a microwave plasma treatment of the silicon dioxide film in an oxygen-containing environment.

18. A non-transitory computer readable medium including instructions, that, when executed by a controller of a processing chamber, causes the processing chamber to perform operations of:
conducting an atomic layer deposition (ALD) cycle on a substrate at a temperature in a range of from 50° C. to 500° C., the ALD cycle comprising:
exposing the substrate to an aminosilane precursor in the processing chamber by pulsing a flow of the aminosilane precursor;
purging the processing chamber of the aminosilane precursor;
conducting a nitrogen treatment including a nitrogen-containing plasma or a hydrazine-containing base on the substrate;
exposing the substrate to an oxidizing agent by pulsing a flow of the oxidizing agent; and
purging the processing chamber of the oxidizing agent; and
repeating the ALD cycle to form a silicon oxide ($SiO_2$) film.

* * * * *